United States Patent [19]

Van Loon et al.

[11] 3,781,696

[45] Dec. 25, 1973

[54] REGENERATOR FOR GENERATING A PULSE SERIES WHICH IS TO BE STABILIZED ON AN INCOMING IMPULSE SERIES

[75] Inventors: Lambertus Jacob Willem Van Loon; Dirk Muilwijk, both of Hilversum, Netherlands

[73] Assignee: U.S. Philips Corporation, New York, N.Y.

[22] Filed: Aug. 23, 1972

[21] Appl. No.: 283,215

[30] Foreign Application Priority Data

Aug. 28, 1971 Netherlands ........................ 7111888

[52] U.S. Cl. .................... 328/164, 328/74, 328/134, 328/141

[51] Int. Cl. ............................................ H03k 5/00

[58] Field of Search ...................... 328/74, 141, 134, 328/164

[56] References Cited

UNITED STATES PATENTS

| | | | |
|---|---|---|---|
| 3,383,465 | 5/1968 | Wilson | 328/164 X |
| 3,390,283 | 6/1968 | Hannigsberg | 328/164 X |
| 3,518,456 | 6/1970 | Mauduit et al. | 328/164 X |
| 3,621,352 | 11/1971 | Dinger | 328/134 X |
| 3,628,159 | 12/1971 | Ellis | 328/141 X |
| 3,242,462 | 3/1966 | Funk et al. | 328/164 X |

*Primary Examiner*—John S. Heyman
*Attorney*—Frank R. Trifari

[57] ABSTRACT

A regenerator for generating a pulse series which is to be stabilized on an incoming pulse series, comprising an input terminal for supplying the incoming pulse series, a pulse oscillator which is provided with a frequency control input and whose oscillation frequency amounts to approximately a multiple of the pulse repetition frequency of the incoming pulse series, a phase loop which comprises a correction unit, provided with a control input, a first dividing stage and a first phase discriminator, the input terminal being coupled, via a zero-passage detector, to a first input of the first phase discriminator so as to apply a control signal to this input, the oscillator being coupled, via the correction unit and the first dividing stage, to a second input of the first phase discriminator so as to supply a comparison signal to this input, an output of the first phase discriminator being coupled to the control input of the correction unit so as to apply to the control input, at the instants of occurrence of the control signal and in accordance with the sign of a phase difference existing between the control signal and a comparison signal, a correction pulse of a first or a second kind, respectively, under the control of which a pulse is suppressed or is added, respectively, to the pulse series originating from the oscillator, an integrator being connected to the output of the first phase discriminator, said integrator being coupled, via a frequency control unit, to the frequency control input of the oscillator, the frequency control unit comprising a second phase loop which is provided with a second phase discriminator, a second dividing stage with an adjustable dividend being connected between the oscillator and a first input of the second phase discriminator, a reference oscillator being connected to a second input of the phase discriminator, a low-pass filter being connected between the output of the second phase discriminator and the frequency control input of the oscillator, the integrator comprising a modulo counting unit, the counting position of which is driven in one direction by the correction pulses of the first kind and in the other direction by the correction pulses of the second kind, said modulo counting unit supplying a counting pulse of a first kind to the frequency control unit when it reaches an extreme position in the one direction, and a counting pulse of a second kind to the frequency control unit when it reaches an extreme position in the other direction, the integrator comprising a forward-backward counter which is connected to the modulo counting unit so as to increase or decrease the counting position of the counter in accordance with the kind of counting pulses applied thereto, the counter being connected to the second counting stage so as to adjust the dividend of the second dividing stage in accordance with the counting position of the counter.

2 Claims, 4 Drawing Figures

REGENERATOR FOR GENERATING A PULSE SERIES WHICH IS TO BE STABILIZED ON AN INCOMING IMPULSE SERIES

The invention relates to a regenerator for generating a pulse series which is to be stabilized on an incoming pulse series, comprising an input terminal for supplying the incoming pulse series, a pulse oscillator which is provided with a frequency control input and whose oscillation frequency amounts to approximately a multiple of the pulse repetition frequency of the incoming pulse series, a phase loop which comprises a correction unit, provided with a control input, a first dividing stage and a first phase discriminator, the input terminal being coupled, via a zero-passage detector, to a first input of the first phase discriminator so as to supply a control signal to this input, the oscillator being coupled, via the correction unit and the first dividing stage, to a second input of the first phase discriminator so as to supply a comparison signal to this input, an output of the first phase discriminator being coupled to the control input of the correction unit so as to supply to the control input, at the instants of co-currence of the control signal and in accordance with the sign of a phase difference which is present between the control signal and the comparison signal, a correction pulse of a first or a second kind, respectively, under the control of which a pulse is suppressed in or is added to a pulse series originating from the oscillator, an integrator being connected to the output of the first phase discriminator, said integrator being coupled to the frequency control input of the oscillator via a frequency control unit.

A regenerator of this kind, offering a high phase accuracy, is known from Netherlands Patent Application 6,908,714, corresponding to U.S. application Ser. No. 43,341, filed June 4, 1970, and now issued as U.S. Pat. No. 3,654,564.

For special applications such as, for example, in telemetry systems for missiles, regenerators are required which must not only have a high phase accuracy but also a large control range and they must be very stable in order not to be detuned by a comparatively long interruption or a poor signal-to-noise ratio of the incoming pulse series.

The regenerator described in the above-identified Netherlands Patent Application 6,908,714 and the corresponding U.S. Patent does not satisfy these requirements due to the fact that the integrator is constructed as a smoothing filter and the fact that the frequency control unit is constructed as a variable reactance.

The invention has for its object to provide a very stable regenerator of the kind set forth which has a large control range and which is particularly suitable, in view of its digital construction, for realization in mainly an integrated form.

The device according to the invention is characterized in that the frequency control unit comprises a second phase loop which is provided with a second phase discriminator, a second dividing stage with an adjustable dividend which is provided between the oscillator and a first input of the second phase discriminator, a reference oscillator which is connected to a second input of the phase discriminator, and a low-pass filter which is provided between the output of the second phase discriminator and the frequency control input of the oscillator, the integrator comprising a modulo counting unit, the counting position of which is driven in one direction by the correction pulses of the first kind and is driven in the other direction by correction pulses of the second kind, said modulo counting unit applying a counting pulse of a first kind to the frequency control unit when it reaches an extreme position in the one direction, and a counting pulse of a second kind to the frequency control unit when it reaches an extreme position in the other direction, the integrator comprising a forward-backward counter which is connected to the modulo counting unit for raising and lowering, in accordance with the kind of counting pulses applied thereto, the counting position of the counter, the counter being connected to the second dividing stage for adjusting the dividend of the second dividing stage in accordance with the counting position of the counter.

The invention will be described in detail with reference to the Figures.

Figure 1:
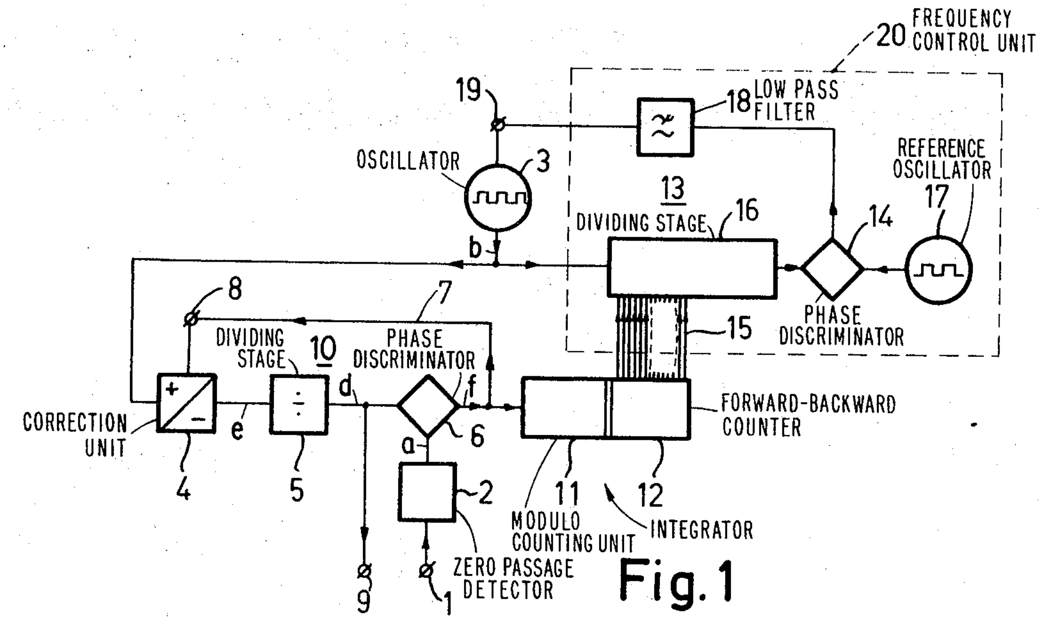
FIG. 1 shows an embodiment of a regenerator according to the invention.
Figure 2:
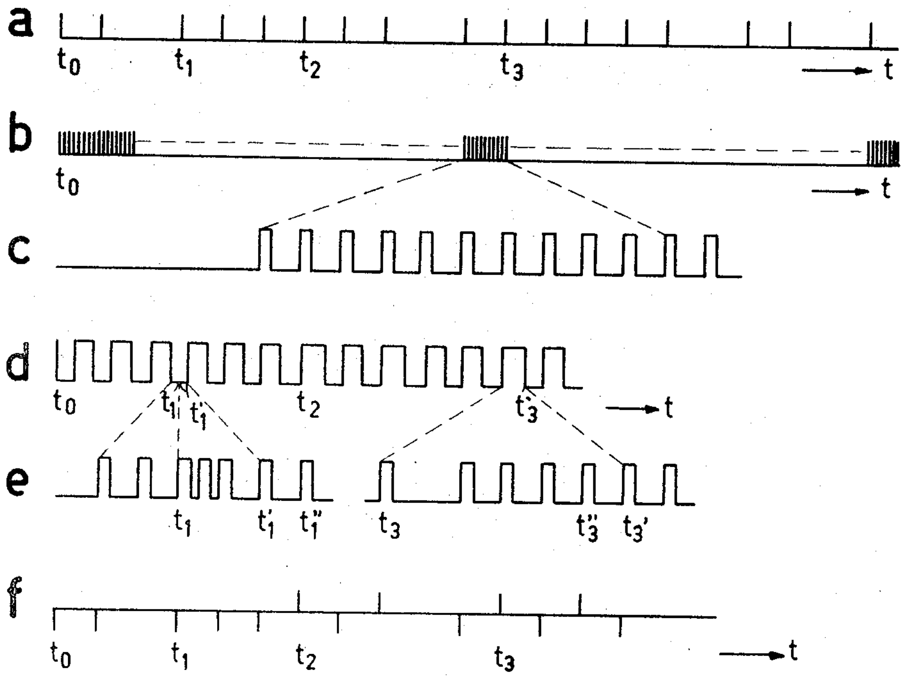
FIGS. 2, 3 and 4 illustrate some signals which can occur in the regenerator shown in FIG. 1.

The regenerator shown in FIG. 1 serves, for example, for generating a pulse series in a telemetry system for missiles, the pulse repetition frequency of this series being equal to the bit frequency of an incoming pulse series which is applied to input terminal 1. This incoming pulse series is composed of information pulses which, in accordance with the information to be transferred by these pulses, are active elements, characterized by a high signal voltage, or rest elements, characterized by a low signal voltage. The transmission rate of the information pulses in this example amounts to 20,000 Baud. This means that at the most 20,000 times per second a signal transition occurs from a high to a low or from a low to a high signal voltage. By means of a zero-passage detector 2 a control signal is derived from these signal transitions, said control signal being shown in FIG. 2a. So as to obtain a pulse series whose pulse repetition frequency is equal to the bit frequency of the incoming pulse series, an oscillator 3 is provided. The pulse repetition frequency of the pulse series supplied by the oscillator 3 amounts to a multiple of the bit frequency of the incoming pulse series. A pulse series which is supplied by the oscillator 3 and whose pulse repetition frequency is, for example, a factor 10 higher than the bit frequency of the incoming pulse series, is shown in FIG. 2*b*. FIG. 2*a* shows a part of the pulse series shown in FIG. 2*b* with an expanded time scale. The signals shown in FIG. 2 are indicated at the appropriate locations in FIG. 1 by corresponding letters. This pulse series is applied, via a correction unit 4, to a first dividing stage 5, the dividend of which is equal to the ratio of the pulse repetition frequency of the pulse series and the bit frequency of the incoming pulse series. This ratio is equal to 10 in the example shown in FIG. 2. The dividing stage 5 supplies a high output signal voltage during five consecutive pulses, and a low output signal voltage during the subsequent five pulses. This output signal, shown in FIG. 2*d*, is applied as the comparison signal to a first input of a first phase discriminator 6. The control signal (FIG. 2*a*) is applied to another input of this first phase discriminator 6. The phase discriminator 6 determines the values of the comparison signal at the instants of appearance of pulses in the control signal. If the value of the comparison signal is low, such as is shown in FIG. 2*d* for the pulse of the control signal which appears at the instant $t_1$ (FIG. 2a), the phase discriminator 6 supplies a correction pulse of a first kind which is a negative pulse in this embodiment. See FIG. 2f. If the value of the comparison signal is high, such as is shown in FIG. 2d for the pulse of the control signal appearing at the instant $t_3$ (FIG. 2a), the phase discriminator 6 supplies a correction pulse of a second kind, which is a positive pulse in this embodiment. See FIG. 2f. These correction pulses are applied to a control input 8 of the correction unit 4 via a return conductor 7. Upon reception of a negative correction pulse, the correction unit 4 adds a pulse in known manner to the pulse series originating from the oscillator 3, as is shown in FIG. 2e which illustrates the situation immediately after the pulse appearing at the instant $t_1$. Consequently, the comparison signal will already change from a low to a high value at the instant $t_1'$ instead of at the instant $t_1''$. This means that the leading edges of the pulses of the comparison signal which appear after the instant $t_1$ are shifted to the left with respect to the control signal over a phase amounting to 2 $\pi$ radians, divided by the dividend of the dividing stage 5.

The correction unit 4 suppresses in known manner a pulse of the pulse series originating from the oscillator 3 after reception of a positive correction pulse, such as is shown in FIG. 2e which illustrates the situation immediately after the pulse appearing at the instant $t_3$. Consequently, the comparison signal will change from a high value to a low value only at the instant $t_3'$ instead of at the instant $t_3''$. This means that the leading edges of the pulses of the comparison signal which appear after the instant $t_2$ are shifted to the right with respect to the control signal over a phase amounting to $2\pi$ radians, divided by the dividend of the dividing stage 5. The phase difference is reduced by these phase transitions. This reduction of the phase difference is shown in FIG. 2d in which a 180° phase difference is assumed to exist between the control signal and the comparison signal at an instant $t_o$, the said phase difference being eliminated at the instant $t_2$. The corrected comparison signal which forms the generated pulse series which is stabilized on the bit frequency of the incoming pulse series is then available from output terminal 9.

If the pulse repetition frequency of the comparison signal differs from the bit frequency of the incoming pulse series, but this frequency difference is so small that the resultant continuous phase variation can still be eliminated by the phase corrections of the phase loop 10, which will be referred to hereinafter as the stabilized state of the phase loop 10, the number of positive correction pulses which is supplied by the phase discriminator 6 will no longer be equal to the number of negative correction pulses. Depending on whether the frequency of the comparison signal is higher or lower than that of the control signal, the number of positive correction pulses will be larger or smaller than the number of negative correction pulses. This difference is used for readjustment of the frequency of the oscillator 3. To this end, the regenerator comprises an integrator 11,12, the output of which is connected, via a frequency control unit 20, to the frequency control input 19 of the oscillator 3. A frequency difference between the comparison signal and the control signal in the stabilized state of the phase loop will be eliminated by means of the integrator 11,12 and the frequency control unit 20.

For the application of the present regenerator in a telemetry system for missiles, very severe requirements are imposed as regards the stability and the control range of this regenerator.

Practical requirements for the abovementioned application are that for a signal-to-noise ratio of 0 dB of the incoming pulse series, transmitted at a rate of 20,000 Baud, the pulse series taken from output terminal 9 should not have a larger slip with respect to the incoming pulse series than 1 in 10,000 pulses, and that upon disappearance of the incoming pulse series for 0.2 second the regenerator should not be detuned, whilst the control range of the regenerator must be at least ± 0.5 percent of the bit frequency of the incoming pulse series. The regenerator described in Netherlands Pat. application No. 6,908,714 and corresponding U.S. Pat. No. 3,654,564 cannot satisfy the above-mentioned stability requirements and width of the operating range due to the fact that use is made of an integrator which is constructed as a smoothing filter having a small integration time and of a frequency control unit which is constructed as variable reactance.

So as to realize a very stable regenerator, the frequency control unit 20 according to the invention comprises, as is shown in FIG. 1, a second phase loop 13 which is provided with a second phase discriminator 14, a second dividing stage 16 with an adjustable dividend, connected between the oscillator 3 and a first input of the second phase discriminator 14, a reference oscillator 17 which is connected to a second input of the second phase discriminator 14, and a low-pass filter 18 which is connected between the output of the second phase discriminator 14 and the frequency control input 19 of the oscillator 3.

The dividend of the second dividing stage 16 has a value such that from the pulse series supplied by the oscillator 3 a pulse series is derived whose pulse repetition frequency is approximately equal to the pulse repetition frequency of a pulse series supplied by the reference oscillator 17. The reference oscillator is preferably a crystal-stabilized oscillator. The second phase discriminator 14 determines the phase difference between the pulse series supplied by the second dividing stage 16 and the pulse series supplied by the reference oscillator 17, and supplies, via the low-pass filter 18, a voltage signal which is proportional to this phase difference to the frequency control input 19 of the oscillator 3. This voltage signal changes the oscillation frequency of the oscillator 3 such that the frequency difference between the pulse series supplied by the second dividing stage 16 and the pulse series supplied by the oscillator 17 is controlled to zero. It is thus achieved that the pulse series supplied by the oscillator 3 has the stability of the pulse series supplied by the reference oscillator 17, and that the frequency of the pulse series supplied by the oscillator 3 is equal to the product of the dividend of the second dividing stage 16 and the pulse repetition frequency of the pulse series supplied by the reference oscillator 17.

So as to enable variation of the frequency of the pulse series supplied by the oscillator 3 while maintaining the stability of the frequency of the reference oscillator 17, in order to obtain a large control range, the integrator 11, 12 according to the invention comprises a modulo counting unit 11 and a forward-backward counter 12. The counting position of the modulo counting unit 11 is driven in one direction by the correction pulses of the first kind and is driven in the other direction by the correction pulses of the second kind. This modulo counting unit 11 supplies a counting pulse of a first kind to the forward-backward counter 12 when it reaches an extreme position in the one direction, and supplies a counting pulse of a second kind to the forward-backward counter 12 when it reaches an extreme position in the other direction. Depending on the kind of the counting pulses applied to the counter 12, the counting position of this counter 12 is increased and decreased, respectively. The counter 12 is connected to the second dividing stage 16 for adjusting the dividend of the second dividing stage 16 in accordance with the counting position of the counter 12.

As already explained, the number of correction pulses of the one kind (negative correction pulses) and the number of correction pulses of the second kind (positive correction pulses) supplied by the phase discriminator 6 will differ in the stabilized state of the control loop 10 when a frequency difference occurs between the control signal and the comparison signal. The modulo counting unit 11 counts these correction pulses. The positive correction pulses are added to the counting contents of this modulo counting unit 11, and the negative correction pulses are subtracted therefrom. When the counting contents reach the extreme positive counting position, the modulo counting unit supplies a counting pulse of a first kind, which is a positive counting pulse in this embodiment, and the counting position is reset to the starting position (zero). If the counting contents reach the extreme negative counting position, which is chosen to be as high as the extreme positive counting position, the counting unit supplies a counting pulse of a second kind which is a negative counting pulse in this embodiment, and the counter is also reset to the starting position. These positive and negative counting pulses are applied to the forward-backward counter 12. The counting position of this counter 12 is increased by one by a positive counting pulse applied thereto, and is reduced by one by a negative counting pulse applied thereto. The counting position of this counter 12 is applied to the second dividing stage 16 via conductors 15. This second dividing stage 16 comprises a series of cascade-connected divide-by-two units. The conductors 15 are connected in a one-to-one relationship, via AND-gates, to set inputs of a corresponding number of first divide-by-two units of the cascade connection. The output of the last divide-by-two unit of the cascade connection is connected to the AND-gates on the one side, via a differentiator, and on the other side to reset inputs of all divide-by-two units. The pulse series applied from the oscillator 3 to the dividing stage 16 is divided by the cascade connection. If the output voltage of the last divide-by-two unit changes in the positive direction, all divide-by-two units are reset via the differentiator and the reset inputs. At the same time the pulse originating from the differentiator is applied as a condition signal to the AND-gates. Under the control of this pulse the counting position of counter 12 is taken over in the cascade connection of divide-by-two units via the conductors 15, the AND-gates, and the set inputs. It is to be noted that the AND-gates are so slow that the divide-by-two units have already been reset before the AND-gates supply the information originating from the counter 12. The dividend of the second dividing stage 16 can be readily changed by changing the presetting of the cascade connection. When the counting position of counter 12 is varied by one, the dividend of the second driving stage 16 is changed by one, and the pulse repetition frequency of the oscillator 3 will be increased or decreased, respectively, by one time the pulse repetition frequency of the reference oscillator 17. It is thus achieved that the frequency of the oscillator 3 can be controlled in steps while the stability of the frequency of the reference oscillator is maintained.

The value of the correction steps of the phase loop 10 must be so small that the regenerator can satisfy the imposed stability requirements. The value of the correction steps of the phase loop 10 is determined by the value of the dividend of the first dividing stage 5. For example, the said practical stability requirements are satisfied if the dividend of the dividing stage 5 has the value 256. To this end, the dividing stage 5 comprises a counter which is composed of 8 cascade-connected divide-by-two units. This counter supplies a high signal voltage during 128 successive pulses which are applied thereto, and supplies a low signal voltage during the subsequent 128 pulses. The transmission rate of the incoming pulse series is 20,000 Baud, so that the pulse repetition frequency of the oscillator 3 must be 5.12 MHz.

This value of the correction steps of the phase loop 10 is accompanied by a very small control range of the phase loop. For every 256 pulses which are applied to the dividing stage 5 one pulse of the comparison signal is supplied. For an information coding where an active or rest element has a 50 percent chance of being followed by an active or rest element, on the average one pulse occurs in the control signal for every two bits in the incoming pulse series. Consequently, one correction pulse is supplied for 512 pulses supplied by the oscillator 3, said correction pulse suppressing one pulse of the pulses supplied by the oscillator 3 or adding one pulse thereto. The control range of the phase loop 10 amounts to 1/5 percent in this example. As a result of the measures according to the invention as described above, the control range of the regenerator is substantially larger than the control range of the phase loop 10. The control range of the regenerator can be further increased by suitable proportioning. The invention is also based on recognition of the fact that the number of positive and the number of negative correction pulses supplied by the phase discriminator 6 when the phase loop 10 is not in the stabilized state, i.e., if a phase drift occurs which is so large that it lies outside the control range of the phase loop 10, are not equal and that therefrom a criterion can be readily deduced which indicates the direction in which the frequency of the oscillator 3 must be adjusted so as to adapt the comparison signal to the control signal while maintaining the phase accuracy.

Figure 3:
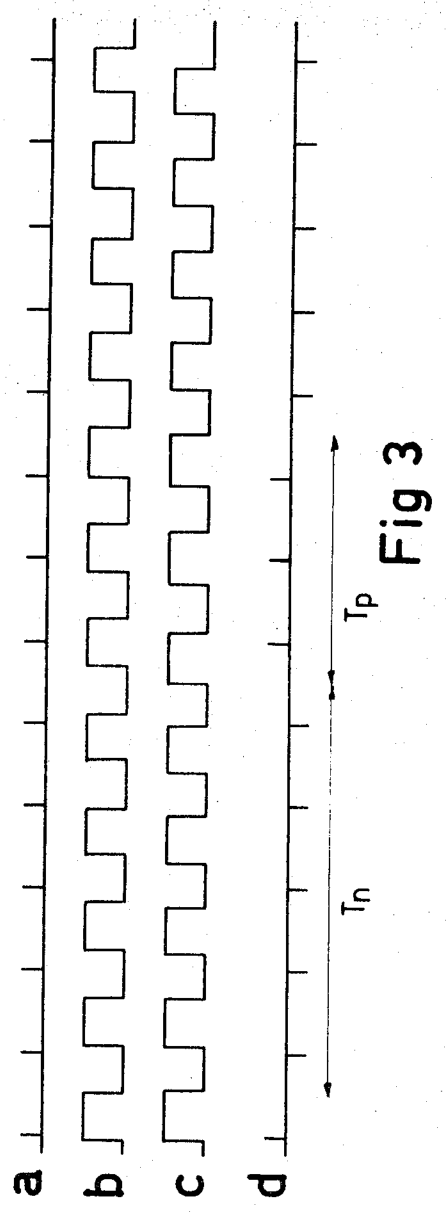

For the description of the operation of the phase loop 10 of FIG. 1 when the loop is not in the stabilized state, it is assumed that the pulse repetition frequency of the comparison signal is lower than the pulse repetition frequency of the control signal. It is also assumed that the correction circuit 4 does not yet suppress or add pulses. FIG. 3*a* shows the control signal and FIG. 3*b* shows the comparison signal which satisfies the above assumptions. As appears from these Figures, the leading edge of each subsequent pulse of the comparison signal is shifted further to the right with respect to each subsequent pulse of the control signal. By means of the FIGS.

$2a$ to $2f$ it was demonstrated that the addition of pulses during the negative state of the comparison signal shifts the leading edges of the pulses of the comparison signal to the left with respect to the pulses of the control signal, and that the suppression of pulses during the positive state of the comparison signal shifts the leading edges of the pulses of the comparison signal to the right with respect to the pulses of the control signal.

The shifts of the leading edges of the pulses of the comparison signal caused by the correction pulses are added to the shift to the right of the leading edges of the pulses of the comparison signal which is caused by the frequency difference. During the time that the pulses of the control signal are in the negative halves of the periods of the comparison signal, the shift to the right of the leading edges will be partly compensated for by the shift to the left which is caused by the correction pulses, and during the time that the pulses of the control signal are in the positive halves of the periods of the comparison signal, the shift to the right of the leading edges will be increased by the shift to the right which is caused by the correction pulses, as is shown in FIG. 3*c*.

The negative part Tn of the period of the floating signal is thus increased, and the positive part T*p* is reduced. The number of negative correction pulses which is supplied during the negative period part T*n* is proportionally larger than the number of correction pulses which is supplied during the positive period part T*p*, the said correction pulses being shown in FIG. 3*d*. The sum of the number of positive and negative correction pulses per period of the floating signal is negative in this case.

Figure 4:
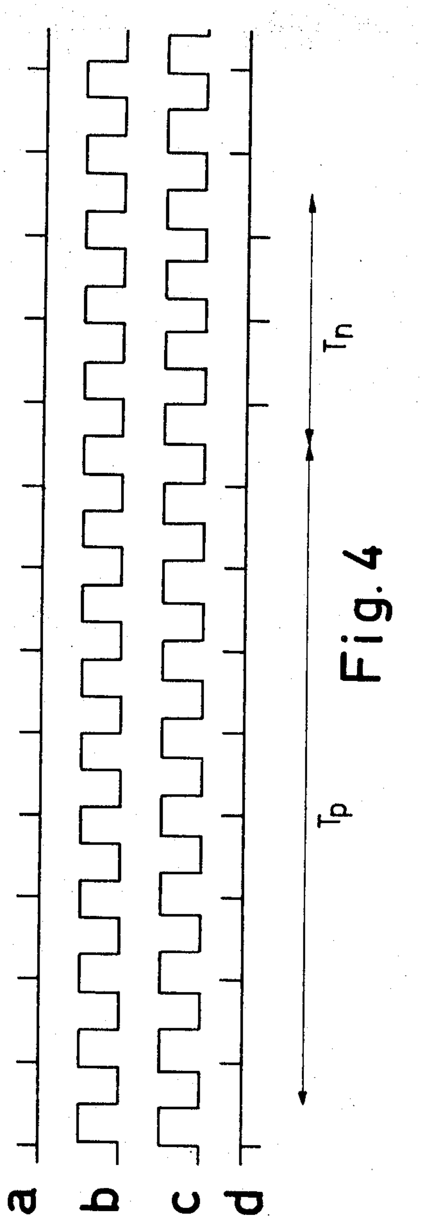

If the pulse repetition frequency of the comparison signal is larger than the pulse repetition frequency of the control signal, the leading edges of each subsequent pulse of the comparison signal will be shifted further to the left with respect to each subsequent pulse of the control signal, as is shown in the FIGS. 4*a* and 4*b*. The effect of the correction pulse on the comparison signal shown in FIG. 4*b* is ignored.

If the shifts which are caused by the correction pulses are added to the shift to the left which is caused by the frequency difference, the shift to the left will be increased, during the occurrence of the control pulses in the negative halves of the pulses of the comparison signal, by the shift to the left which is caused by the correction pulses, and the shift to the left will be partly compensated for, during the appearance of the control pulses in the positive halves of the pulses of the comparison signal, by the shift to the right which is caused by the correction pulses, so that the comparison signal shown in FIG. 4*c* is obtained. The negative part T*n* of the floating period is reduced, and the positive part T*p* is increased. The number of negative correction pulses which is supplied during the negative part T*n* of the period of the floating signal, consequently, is smaller than the number of positive correction pulses which is supplied during the positive part T*p* of the period of the floating signal, as is shown in FIG. 4*d*. The sum of the number of correction pulses per period of the floating signal is positive.

The sign of the sum over a floating period unambiguously indicates whether the pulse repetition frequency of the comparison signal is higher or lower than that of the control signal. The extreme counting position of the modulo counting unit 11 is preferably chosen to be equal to the dividend of the first dividing stage 5, i.e., 256. Each correction pulse shifts the comparison signal with respect to the control signal over a phase which is equal to $2\pi$ radians, divided by the dividend of the dividing stage 5. When the modulo counting unit 11 has detected a difference between the number of positive and negative correction pulses which is equal to the dividend of the dividing stage 5, it is thus detected that the comparison signal has been shifted $2\pi$ radians with respect to the control signal. In reaction thereto a counting pulse is supplied. If use were made of the integrator described in Netherlands Patent application No. 6,908,714, corresponding to U.S. Pat. No. 3,654,564 having a fixed integration time and, consequently, correcting the frequency independent of a given detected phase error, the control accuracy in the non-stabilized state of the phase loop 10 would be adversely affected. If the extreme counting position of the modulo counting unit 11 is too low, correction is performed before the phase loop has detected an error of one given period, and if the extreme counting position is too high, the pull-in time of the phase loop 10 of the regenerator will be unnecessarily large. The extreme positions of the modulo counting unit 11, consequently, are preferably chosen to be such that the phase control range amounts to two times $2\pi$ radians.

In the case of a stability of $10^{-4}$ and a transmission rate of 20,000 Baud, the step-wise adjustment of the frequency of the oscillator 3 must be so large that the comparison signal frequency is shifted 2 Hz per step. For a dividend of 256 of the first dividing stage this means a frequency variation of 512 Hz of the pulse series supplied by the oscillator 3, so that the pulse repetition frequency of the pulse series supplied by the reference oscillator 17 must be 512 Hz. This frequency is obtained by composing the reference oscillator 17 of a crystal-stabilized oscillator and a third dividing stage, a pulse series having the required pulse repetition frequency being derived, by means of the third dividing stage, from the pulse repetition frequency of the pulse series supplied by the crystal-stabilized oscillator. The pulse repetition frequency of the oscillator 3 amounts to 5.12 MHz for the said dividend of the first counting stage and the said transmission rate.

The dividend of the second dividing stage 16 has a value which is determined by the stability requirement and which is equal to the quotient of the pulse repetition frequencies of the oscillator 3 and the regenerator 17, said quotient being equal to 10,000. So as to obtain a regenerator control range of $\pm 0.5$ percent, it must be possible to vary this dividend by $\pm 50$. To this end, the forward-backward counter 12 has a counting capacity of 100 and is coupled to the second divider of the second dividing stage 16 such that the dividend of the second dividing stage 16 is 10,000 for a counting contents 50 of the counter 12.

What is claimed is:

1. A regenerator for generating a pulse series which is to be stabilized on an incoming pulse series, comprising an input terminal for supplying the incoming pulse series, a pulse oscillator which is provided with a frequency control input and whose oscillation frequency amounts to approximately a multiple of the pulse repetition frequency of the incoming pulse series, a phase loop which comprises a correction unit, provided with a control input, a first dividing stage and a first phase discriminator, the input terminal being coupled, via a zero-passage detector, to a first input of the first phase discriminator so as to supply a control signal to this input, the oscillator being coupled, via the correction unit and the first dividing stage, to a second input of the first phase discriminator so as to supply a comparison signal to this input, an output of the first phase discriminator being coupled to the control input of the correction unit so as to supply to this control input, at the instants of occurrence of the control signal and in accordance with the sign of a phase difference which exists between the control signal and the comparison signal, a correction pulse of a first or a second kind, respectively, under the control of which a pulse is suppressed in or is added, to the pulse series originating from the oscillator, an integrator being connected to the output of the first phase discriminator, said integrator being coupled, via a frequency control unit, to the frequency control input of the oscillator, characterized in that the frequency control unit comprises a second phase loop which is provided with a second phase discriminator, a second dividing stage with an adjustable dividend which is connected between the oscillator and a first input of the second phase discriminator, a reference oscillator which is connected to a second input of the phase discriminator, and a low-pass filter which is provided between the output of the second phase discriminator and the frequency control input of the oscillator, the integrator comprising a modulo counting unit, the counting position of which is driven in one direction by the correction pulses of the first kind and is driven in the other direction by the correction pulses of the second kind, said modulo counting unit applying a counting pulse of a first kind to the frequency control unit when it reaches an extreme position in the one direction, and a counting pulse of a second kind to the frequency control unit when it reaches an extreme position in the other direction, the integrator comprising a forward-backward counter which is connected to the modulo counting unit for raising and lowering the counting position of the counter in accordance with the kind of counting pulses applied thereto, the counter being connected to the second dividing stage so as to adjust the dividend of the second dividing stage in accordance with the counting position of the counter.

2. A regenerator as claimed in claim 1, characterized in that the values of the extreme positions of the modulo counting unit are equal to the value of the dividend of the first dividing stage.

* * * * *